(12) United States Patent
Swaminathan et al.

(10) Patent No.: US 8,956,704 B2
(45) Date of Patent: Feb. 17, 2015

(54) METHODS FOR MODULATING STEP COVERAGE DURING CONFORMAL FILM DEPOSITION

(71) Applicant: Novellus Systems, Inc., San Jose, CA (US)

(72) Inventors: Shankar Swaminathan, Hillsboro, OR (US); Hu Kang, Tualatin, OR (US); Adrien LaVoie, Portland, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 13/890,346

(22) Filed: May 9, 2013

(65) Prior Publication Data

US 2013/0309415 A1 Nov. 21, 2013

Related U.S. Application Data

(60) Provisional application No. 61/649,660, filed on May 21, 2012.

(51) Int. Cl.
*H05H 1/24* (2006.01)
*C23C 16/52* (2006.01)
*C23C 16/04* (2006.01)
*C23C 16/455* (2006.01)

(52) U.S. Cl.
CPC ............... *C23C 16/52* (2013.01); *C23C 16/045* (2013.01); *C23C 16/45523* (2013.01)
USPC ......................................... 427/569; 427/576

(58) Field of Classification Search
USPC .......................................... 427/569, 573, 576
See application file for complete search history.

(56) References Cited

U.S. PATENT DOCUMENTS

| 3,717,974 | A | * | 2/1973 | Batta ................................. 95/98 |
| 4,948,391 | A | * | 8/1990 | Noguchi ............................ 95/98 |
| 5,369,191 | A | * | 11/1994 | Kawakami et al. ........... 525/471 |
| 6,009,827 | A | | 1/2000 | Robles et al. |
| 6,319,324 | B1 | | 11/2001 | Nguyen et al. |
| 6,878,419 | B2 | | 4/2005 | David et al. |
| 6,887,721 | B2 | * | 5/2005 | Hasegawa et al. ................. 438/5 |
| 7,196,020 | B2 | | 3/2007 | Sharan et al. |
| 8,012,859 | B1 | | 9/2011 | Joe et al. |
| 8,101,531 | B1 | | 1/2012 | Li et al. |
| 8,110,493 | B1 | | 2/2012 | Subramonium et al. |
| 2007/0254096 | A1 | * | 11/2007 | Hepper et al. ................. 427/237 |
| 2011/0256726 | A1 | * | 10/2011 | LaVoie et al. ................. 438/702 |

FOREIGN PATENT DOCUMENTS

| JP | 62-121615 | * | 6/1987 |
| JP | 11-108279 | * | 4/1999 |
| WO | WO 03/028069 A2 | | 4/2003 |

* cited by examiner

*Primary Examiner* — Bret Chen

(57) ABSTRACT

Methods for processing a substrate include a) arranging a substrate on a pedestal in a processing chamber; b) supplying precursor to the processing chamber; c) purging the processing chamber; d) performing radio frequency (RF) plasma activation; e) purging the processing chamber; and f) prior to purging the processing chamber in at least one of (c) or (e), setting a vacuum pressure of the processing chamber to a first predetermined pressure that is less than a vacuum pressure during at least one of (b) or (d) for a first predetermined period.

17 Claims, 5 Drawing Sheets

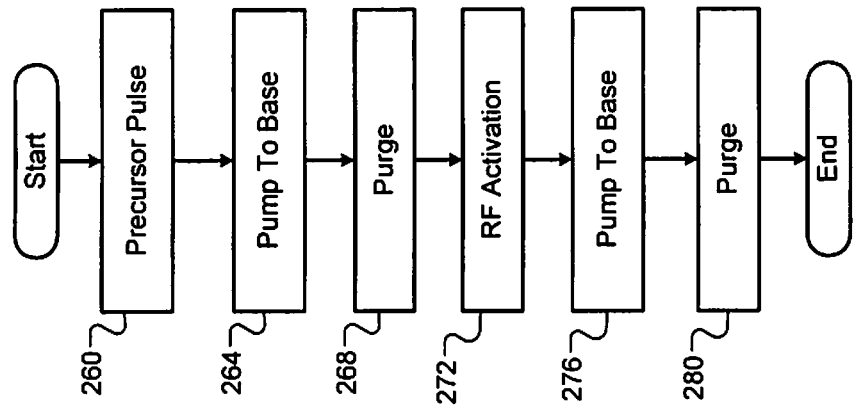
FIG. 5
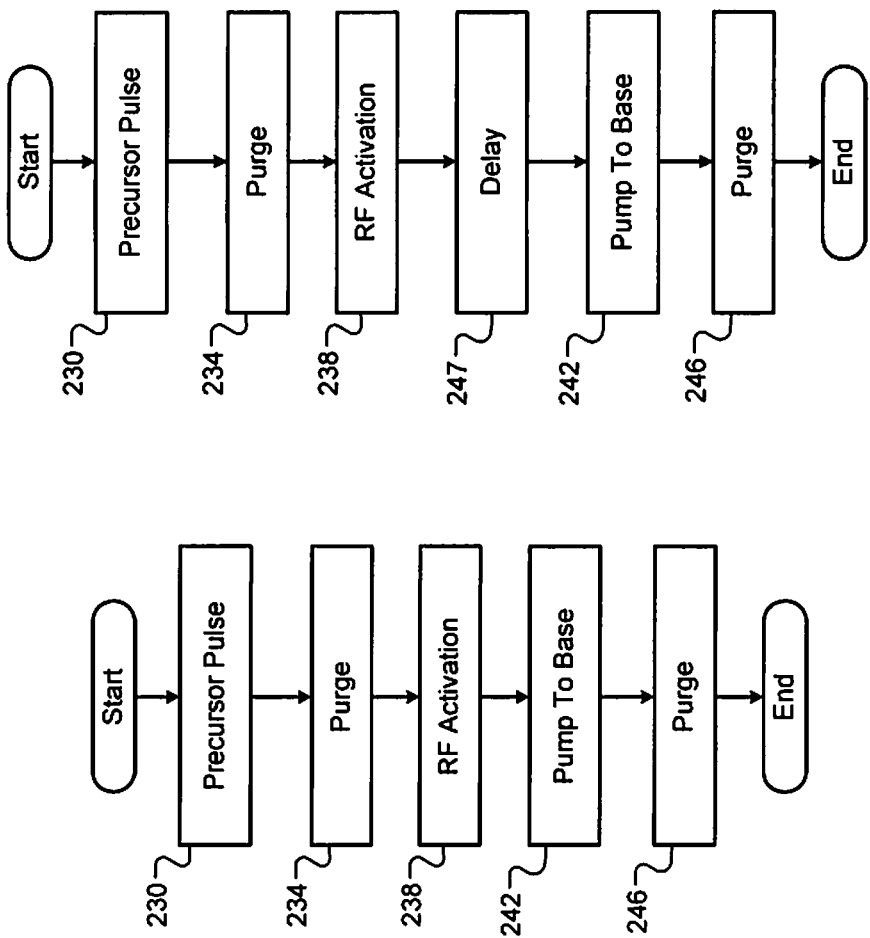
FIG. 4B
FIG. 4A

US 8,956,704 B2

METHODS FOR MODULATING STEP COVERAGE DURING CONFORMAL FILM DEPOSITION

CROSS-REFERENCE TO RELATED APPLICATIONS

This application claims the benefit of U.S. Provisional Application No. 61/649,660 filed on May 21, 2012. The entire disclosure of the application referenced above is incorporated herein by reference.

FIELD

The present disclosure relates to substrate processing systems, and more particularly to modulation of step coverage during conformal film deposition in substrate processing systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch or deposit layers on substrates such as semiconductor wafers. In some examples, an exposed surface of the substrate may include a top surface and one or more trenches including side walls and a trench bottom. In some applications, it may be desirable to deposit a film with a uniform thickness on two or more of the top surface, the side walls and/or the trench bottom.

Superconformality is defined as the ratio of conformal film deposition (CFD) oxide thickness on a trench sidewall (vertical feature) relative to a trench bottom or top surface (horizontal feature). Different applications may require different step coverage of CFD oxide.

For example, CFD oxide films that may be used as through-silicon via (TSV) liners may need to have a predetermined thickness on the sidewalls to meet dielectric requirements. In this application, the CFD oxide film is preferably superconformal. A higher deposition rate for the sidewall features impacts throughput favorably. Furthermore, a thinner film on the top horizontal surface allows faster and lower cost chemical mechanical polishing (CMP). In other words, step coverage greater than 100% may be desirable in this application.

Alternatively, for other CFD oxide films, such as dielectric spacers, 100% step coverage may be important.

BRIEF DESCRIPTION OF THE DRAWINGS

The present disclosure will become more fully understood from the detailed description and the accompanying drawings, wherein:

FIGS. 3-5 are examples of flowcharts illustrating steps of conformal film deposition (CFD) processes according to the present disclosure;

SUMMARY

Figure 1:
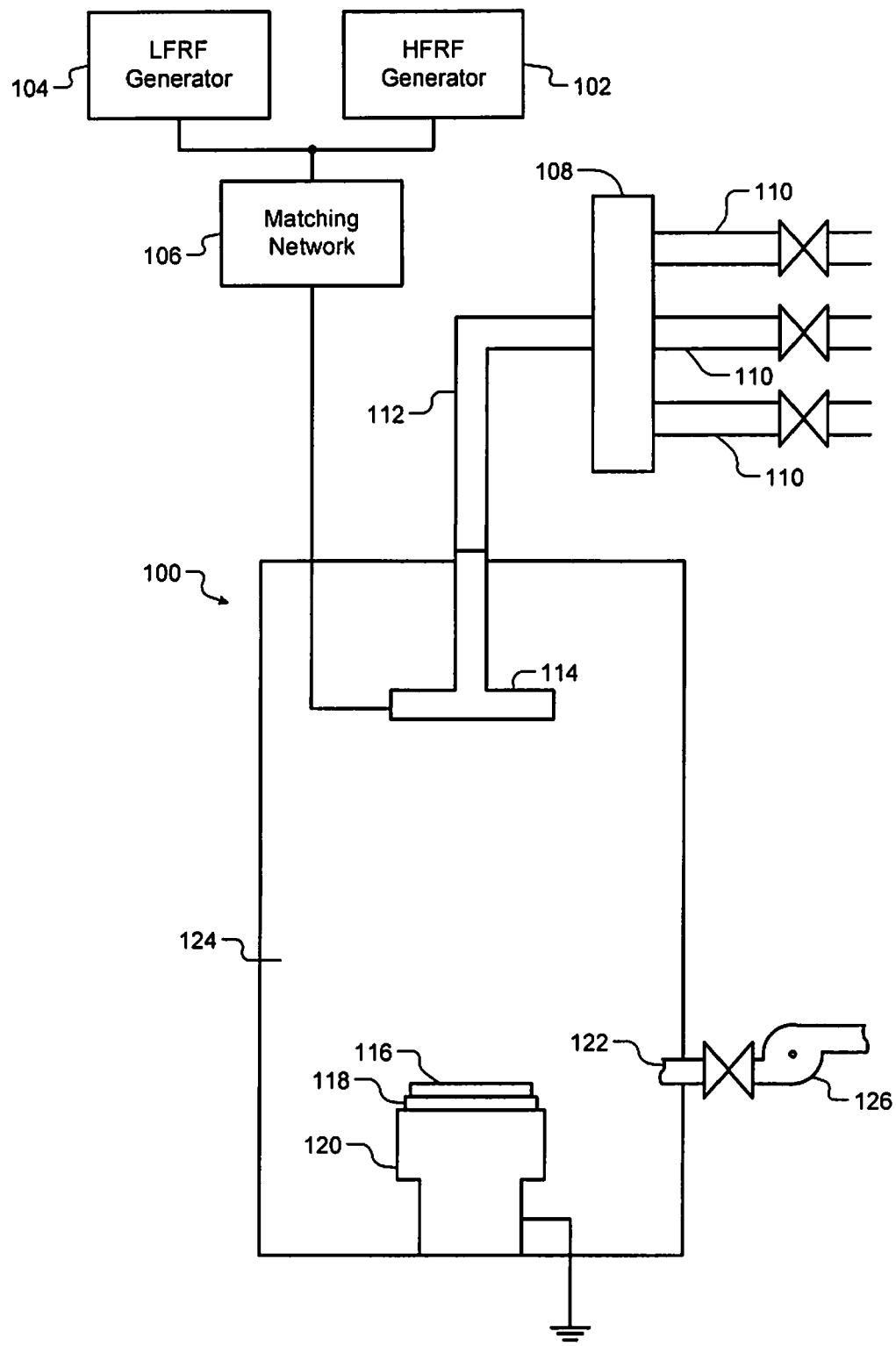
FIG. 1 is a functional block diagram of an example of a plasma enhanced chemical vapor deposition (PECVD) system.

A method for processing a substrate includes a) arranging a substrate on a pedestal in a processing chamber; b) supplying precursor to the processing chamber; c) purging the processing chamber; d) performing radio frequency (RF) plasma activation; e) purging the processing chamber; and f) prior to purging the processing chamber in at least one of (c) or (e), setting a vacuum pressure of the processing chamber to a first predetermined pressure that is less than a vacuum pressure during at least one of (b) or (d) for a first predetermined period.

In other features, the first predetermined period is greater than or equal to 0.5 seconds and less than or equal to 5 seconds. In other features, (f) is performed before both (c) and (e). In other features, (f) is performed before (e), and further comprising waiting a predetermined period after (d) and before (f).

In other features, the method includes flowing oxidants during (f). The oxidants comprise one of molecular oxygen and nitrous oxide. The RF plasma activation comprises RF plasma oxidation. Vacuum pressure in the processing chamber during (b), (c), (d), and (e) is greater than or equal to 1 Torr and less than or equal to 15 Torr. Vacuum pressure in the processing chamber during (b), (c), (d), and (e) is greater than or equal to 3 Torr and less than or equal to 8 Torr. Vacuum pressure in the processing chamber during (f) is greater than or equal to 5 mTorr and less than or equal to 2 Torr. Vacuum pressure in the processing chamber during (f) is greater than or equal to 5 mTorr and less than or equal to 500 mTorr.

In other features, vacuum pressure in the processing chamber is approximately isobaric during (b), (c), (d) and (e).

A method for processing a substrate includes a) arranging a substrate on a pedestal in a processing chamber; b) supplying precursor to the processing chamber; c) purging the processing chamber; d) performing radio frequency (RF) plasma activation; e) purging the processing chamber; and f) prior to purging the processing chamber in at least one of (c) or (e), setting a vacuum pressure of the processing chamber to a first predetermined pressure that is less than a vacuum pressure during at least one of (b) or (d) for a first predetermined period. Vacuum pressure in the processing chamber is greater than or equal to 3 Torr and less than or equal to 8 Torr during (b), (c), (d) and (e) and is approximately isobaric during (b), (c), (d) and (e). Vacuum pressure in the processing chamber during (f) is greater than or equal to 5 mTorr and less than or equal to 2 Torr.

In other features, vacuum pressure in the processing chamber during (f) is greater than or equal to 5 mTorr and less than or equal to 500 mTorr.

A system for processing a substrate includes a processing chamber including a pedestal to support a substrate. A controller is configured to: a) supply precursor to the processing chamber; b) purge the processing chamber; c) perform radio frequency (RF) plasma activation; d) purge the processing chamber; and e) prior to purging the processing chamber in at least one of (b) or (d), set a vacuum pressure of the processing chamber to a first predetermined pressure that is less than a vacuum pressure during the at least one of (a) or (c) for a first predetermined period.

In other features, the first predetermined period is greater than or equal to 0.5 seconds and less than or equal to 5 seconds. The controller is configured to perform (e) before both (b) and (d). The controller is configured to perform (e) before (d) and to wait a predetermined period after (c) and before (e).

In other features, the controller is configured to flow oxidants during (e). The oxidants comprise one of molecular oxygen and nitrous oxide. The RF plasma activation comprises RF plasma oxidation.

Further areas of applicability of the present disclosure will become apparent from the detailed description, the claims and the drawings. The detailed description and specific examples are intended for purposes of illustration only and are not intended to limit the scope of the disclosure.

DETAILED DESCRIPTION

Referring now to FIG. 1, an example of a PECVD system 100 is shown. While a specific PECVD system is shown, the present disclosure applies to other deposition systems such as but not limited to other PECVD systems, plasma enhanced atomic layer deposition (PEALD) systems or other deposition systems.

The PECVD system 100 shown in FIG. 1 includes a process chamber 124, which encloses other components of the reactor and contains the plasma. The plasma may be generated by a capacitor-type system including a showerhead 114 working in conjunction with a grounded heater block 120. In some examples, the showerhead may be a chandelier-type showerhead or flush mounted to a top plate, side wall or chamber body. A high-frequency RF generator 102 and a low-frequency RF generator 104 are connected to a matching network 106 and to the showerhead 114. The power and frequency supplied by matching network 106 is sufficient to generate plasma from the process gas.

Within the processing chamber 124, a substrate 116 is arranged on a pedestal 118. The pedestal 118 typically includes a chuck, a fork, or lift pins to hold and transfer the substrate during and between the deposition and/or plasma treatment reactions. The chuck may be an electrostatic chuck, a mechanical chuck or other type of chuck.

Process gases are introduced via inlet 112. Multiple source gas lines 110 are connected to manifold 108. The gases may be premixed or not. Appropriate valving and mass flow control mechanisms are employed to ensure that the correct gases are delivered during the deposition and plasma treatment phases of the process.

Process gases exit the processing chamber 124 via an outlet 122. A vacuum pump 126 (e.g., a one or two stage mechanical dry pump and/or a turbomolecular pump) draws process gases out and maintains a suitably low pressure within the reactor by a close loop controlled flow restriction device, such as a throttle valve or a pendulum valve. It is possible to index the wafers after every deposition and/or post-deposition plasma anneal treatment until all the required depositions and treatments are completed, or multiple depositions and treatments can be conducted at a single station before indexing the wafer.

Figure 2:
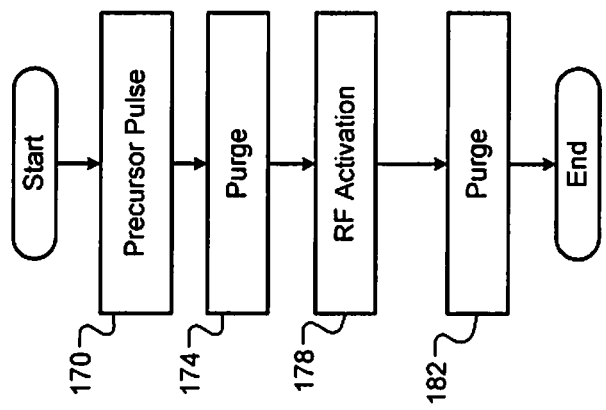
FIG. 2 is a flowchart illustrating steps of a conformal film deposition (CFD) process.

Referring now to FIG. 2, an example of a method for depositing a conformal film deposition (CFD) layer is shown. A substrate is arranged in the processing chamber. At 170, a precursor pulse is introduced into the processing chamber. At 174, the precursor is purged after a predetermined period. At 178, radio frequency (RF) activation is performed. At 182, a purge step is performed.

Additional details and examples relating to precursor pulse steps and RF plasma activation steps for CFD films can be found in "Precursors for Plasma Activated Conformal Film Deposition", U.S. patent application Ser. No. 13/409,212, filed on Mar. 1, 2012, which is hereby incorporated by reference in its entirety. In some examples, the RF plasma activation comprises RF oxidation.

To modulate step coverage, an example of a method according to the present disclosure adds one or more pump to base steps to the process as shown in FIG. 2. For example only, the pump to base step may be used to modulate step coverage of a CFD oxide process. As used herein, the pump to base step includes setting a pressure setpoint to a base pressure within a predetermined period prior to a subsequent purge step. For example only, the pump to base step may have a vacuum pressure that is less than a preceding and/or subsequent step. For example only, the pressure setpoint may be less than or equal to 500 mTorr and the predetermined period may be a period in a range from 0.5 seconds to 5 seconds.

In some examples, gases may be supplied to the processing chamber during the pump to base step. In other examples, the gases may not be supplied to the processing chamber during the pump to base step.

In other examples, a predetermined delay may be inserted between the RF plasma activation step and the pump to base step. For example only, the predetermined delay may have a period of between 0.25 seconds and 5 seconds, although other values may be used. For example only, the predetermined delay may have a period of approximately 0.5 seconds, although other values may be used. The predetermined delay tends to reduce superconformality for a given duration of the pump to base period. For example only, the inclusion of a 0.5 seconds delay period between the RF plasma activation step and the subsequent pump to base step having a duration of 0.5 seconds decreased superconformality from 109% to 105%. In some examples, the predetermined delay step between the RF plasma activation step and the subsequent pump to base step has oxidants flowing ($O_2$/$N_2O$) that may "quench" some residual plasma species.

In some examples, vacuum pressure in the processing chamber during the precursor pulse is 1 Torr to 15 Torr. In other examples, vacuum pressure in the processing chamber during the precursor pulse is 3 Torr to 8 Torr. In some examples, vacuum pressure in the processing chamber during at least one of pre-dose or post-dose purging is 1 Torr to 15 Torr. In other examples, vacuum pressure in the processing chamber during at least one of pre-dose or post-dose purging is 3 Torr to 8 Torr.

In some examples, vacuum pressure in the processing chamber during the RF plasma activation is 1 Torr to 15 Torr. In other examples, vacuum pressure in the processing chamber during RF plasma activation is 3 Torr to 8 Torr. In some examples, vacuum pressure in the processing chamber during the pump to base step is 5 mTorr to 2 Torr. In other examples, vacuum pressure in the processing chamber during the pump to base step is 5 mTorr to 500 mTorr.

In some examples, the vacuum pressure is approximately isobaric during dose, purge, RF plasma activation and purge steps. As used herein, approximately isobaric refers to maintaining vacuum pressure to a vacuum pressure range that is 10% of a predetermined vacuum pressure value. In some examples, approximately isobaric refers to maintaining vacuum pressure to a vacuum pressure range that is 10%, 5%, 2.5%, 1% or less of a predetermined vacuum pressure value.

During the pump to base step, the vacuum pressure is reduced relative to the preceding and/or following steps. In some examples, the vacuum pressure is reduced during the pump to base step by at least 50%, 60%, 70%, 80%, 90% or greater relative to the preceding and/or following steps. In some examples, the vacuum pressure is reduced during the pump to base step by at least 1 Torr, 2 Torr, 3 Torr, 4 Torr, 5 Torr, 6 Torr, 7 Torr, 8 Torr or greater relative to the preceding and following steps.

Figure 3:
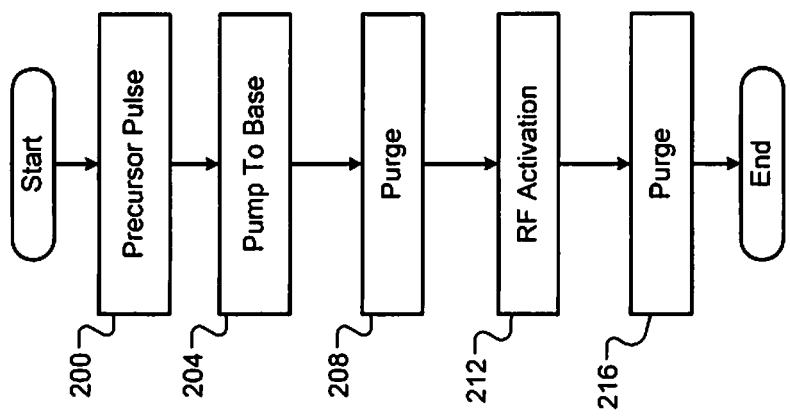

Referring now to FIG. 3, an example of a method for depositing a conformal film deposition (CFD) layer according to the present disclosure is shown. A substrate is arranged in the processing chamber. At 200, a precursor pulse is introduced into the processing chamber. After a first predetermined period, a pump to base step is performed at 204. After a second predetermined period, the precursor is purged at 208. At 212, RF plasma activation is performed. After a third predetermined period, a purge step is performed at 216.

Referring now to FIGS. 4A-5, variants may include one or more pump to base steps either after the precursor dose and/or the RF plasma activation step. In FIG. 4A, an example of a method for depositing a conformal film deposition (CFD) layer according to the present disclosure is shown. A substrate is arranged in the processing chamber. At 230, a precursor pulse is introduced into the processing chamber. After a first predetermined period, the precursor is purged at 234. At 238, RF plasma activation is performed. After a second predetermined period, a pump to base step is performed at 242. After a third predetermined period, a purge step is performed at 246. In FIG. 4B, a predetermined delay period at 247 is provided between the RF plasma activation step at 238 and the pump to base step at 242.

In FIG. 5, an example of a method for depositing a conformal film deposition (CFD) layer according to the present disclosure is shown. A substrate is arranged in the processing chamber. At 260, a precursor pulse is introduced into the processing chamber. After a first predetermined period, a pump to base step is performed at 264. After a second predetermined period, the precursor is purged at 268. At 272, RF plasma activation is performed. After a third predetermined period, a pump to base step is performed at 276. After a fourth predetermined period, a purge step is performed at 280. In some examples, a predetermined delay period is provided between the RF plasma activation step and the pump to base step in a manner similar to FIG. 4B.

Figure 6:
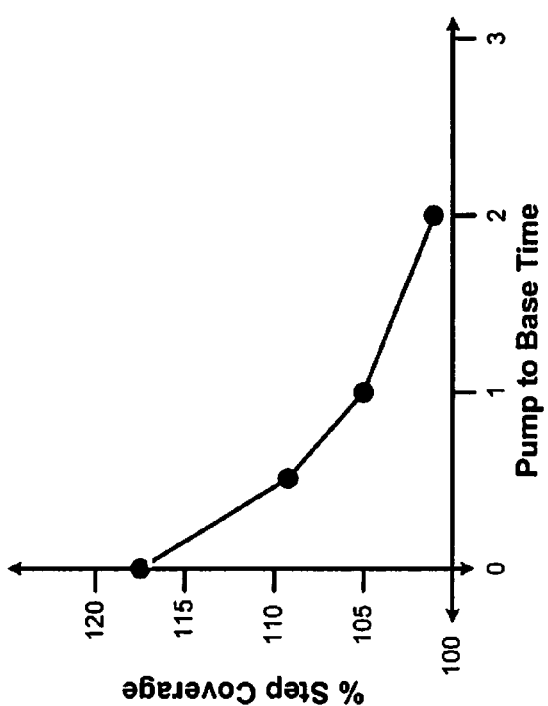
FIG. 6 is a graph illustrating step coverage as a function of a pump to base period.

The controllable process inputs for the pump to base step include the period of the pump to base step, gas flows and a pressure setpoint. Referring now to FIG. 6, the length of the pump to base step approximately correlates monotonically with the extent of superconformality.

Figure 7:
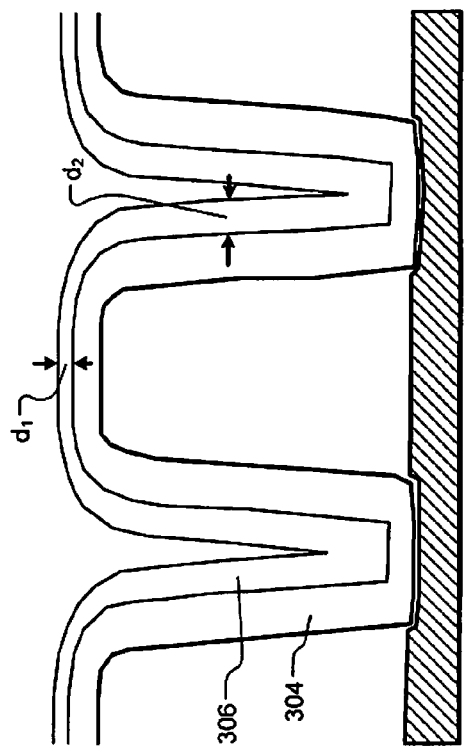
FIG. 7 is a cross-sectional view illustrating step coverage of a CFD film.

Referring now to FIG. 7, a CFD layer 306 is deposited on an underlying layer 304. In one example, a process had ~120% superconformality of the layer 306 for 200-Å thick film on a wafer for a spacer application. Using a post-RE plasma activation pump to base step, superconformality decreased from 120% ($d_2/d_1$) to 101% ($d_2/d_1$) by increasing the period of the pump to base step.

Figure 8:
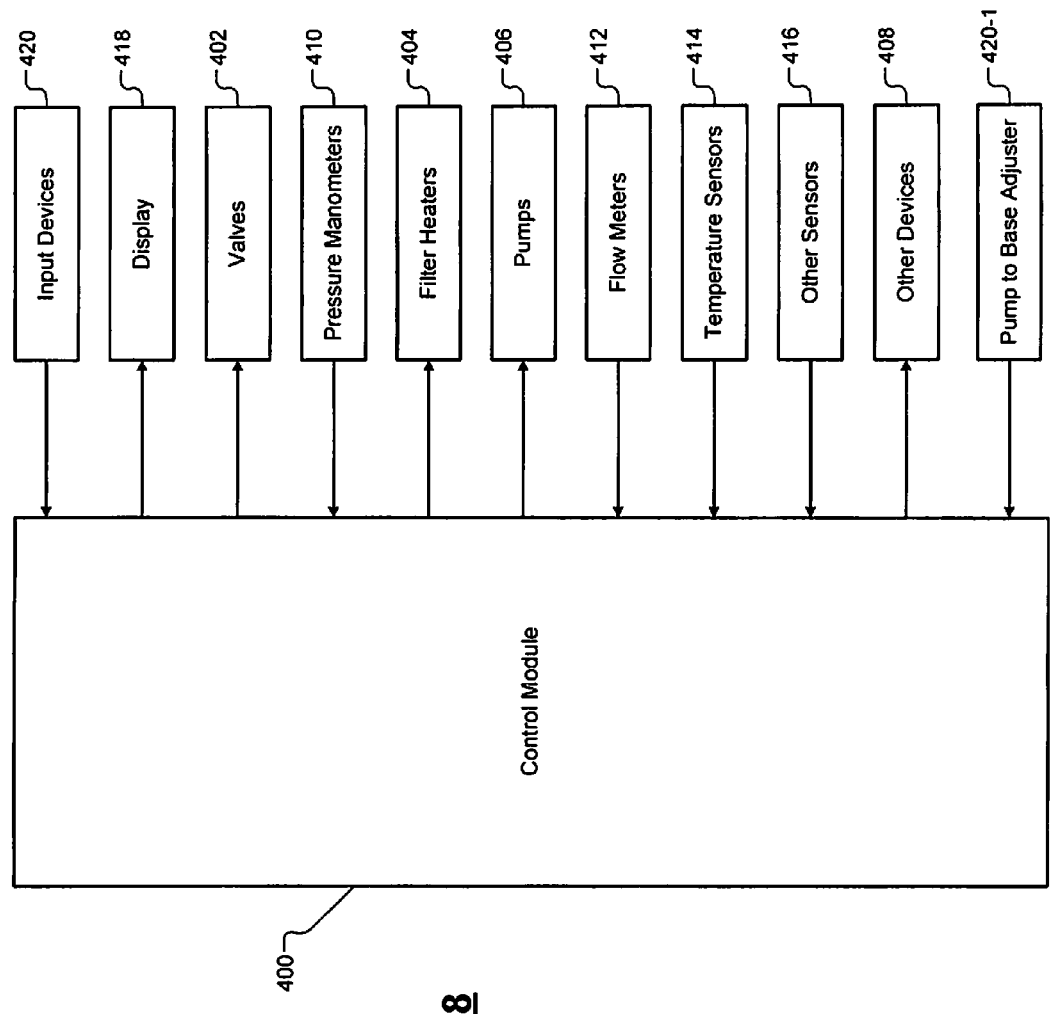
FIG. 8 is a functional block diagram of an example of a control module for the system of FIG. 1.

Referring now to FIG. 8, an example of a control module 400 for controlling the system of FIG. 1 is shown. The control module 400 may include a processor, memory and one or more interfaces. The control module 400 may be employed to control devices in the system based in part on sensed values.

For example only, the control module 400 may control one or more of valves 402, filter heaters 404, pumps 406, and other devices 408 based on the sensed values and other control parameters. The control module 400 receives the sensed values from, for example only, pressure manometers 410, flow meters 412, temperature sensors 414, and/or other sensors 416. One or more input devices 420 may be used. For example, the input devices 420 may include a pump to base adjuster 420-1, which allows adjustment of the pump to base pressure or the pump to base period. The control module 400 may also be employed to control process conditions during precursor delivery and deposition of the film. The control module 400 will typically include one or more memory devices and one or more processors.

The control module 400 may control activities of the precursor delivery system and deposition apparatus. The control module 400 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 400 may also monitor the pressure differential and automatically switch vapor precursor delivery from one or more paths to one or more other paths. Other computer programs stored on memory devices associated with the control module 400 may be employed in some embodiments.

Typically there will be a user interface associated with the control module 400. The user interface may include a display 418 (e.g. a display screen and/or graphical software displays of the apparatus and/or process conditions), and user input devices 420 such as pointing devices, keyboards, touch screens, microphones, etc.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 410, and thermocouples located in delivery system, the pedestal or chuck (e.g. the temperature sensors 414). Appropriately programmed feedback and control algorithms may be used with data from these sensors to maintain desired process conditions. The foregoing describes implementation of embodiments of the invention in a single or multi-chamber semiconductor processing tool.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A method for processing a substrate, comprising:
   a) arranging a substrate on a pedestal in a processing chamber;
   b) supplying precursor to the processing chamber;
   c) purging the processing chamber;
   d) performing radio frequency (RF) plasma activation;
   e) purging the processing chamber; and
   f) prior to purging the processing chamber in at least one of (c) or (e), setting a vacuum pressure of the processing chamber to a first predetermined pressure that is less than a vacuum pressure during at least one of (b) or (d) for a first predetermined period.

2. The method of claim 1, wherein the first predetermined period is greater than or equal to 0.5 seconds and less than or equal to 5 seconds.

3. The method of claim 1, wherein (f) is performed before both (c) and (e).

4. The method of claim 1, wherein (f) is performed before (e), and further comprising waiting a predetermined period after (d) and before (f).

5. The method of claim 1, further comprising flowing oxidants during (f).

6. The method of claim 5, wherein the oxidants comprise one of molecular oxygen and nitrous oxide.

7. The method of claim 1, wherein the RF plasma activation comprises RF plasma oxidation.

8. The method of claim 1, wherein vacuum pressure in the processing chamber is greater than or equal to 1 Torr and less than or equal to 15 Torr during (b), (c), (d) and (e).

9. The method of claim 8, wherein vacuum pressure in the processing chamber during (b), (c), (d) and (e) is approximately isobaric.

10. The method of claim 8, wherein vacuum pressure in the processing chamber during (f) is greater than or equal to 5 mTorr and less than or equal to 2 Torr.

11. The method of claim 1, wherein vacuum pressure in the processing chamber is greater than or equal to 3 Torr and less than or equal to 8 Torr during (b), (c), (d) and (e).

12. The method of claim 11, wherein vacuum pressure in the processing chamber during (b), (c), (d) and (e) is approximately isobaric.

13. The method of claim 11, wherein vacuum pressure in the processing chamber during (f) is greater than or equal to 5 mTorr and less than or equal to 500 mTorr.

14. The method of claim 1, further comprising performing plasma-enhanced chemical vapor deposition in the processing chamber.

15. The method of claim 1, further comprising performing plasma-enhanced atomic layer deposition in the processing chamber.

16. The method of claim 1, further comprising flowing process gas during (f).

17. A method for processing a substrate, comprising:
   a) arranging a substrate on a pedestal in a processing chamber;
   b) supplying precursor to the processing chamber;
   c) purging the processing chamber;
   d) performing radio frequency (RF) plasma activation;
   e) purging the processing chamber; and
   f) prior to purging the processing chamber in at least one of (c) or (e), setting a vacuum pressure of the processing chamber to a first predetermined pressure that is less than a vacuum pressure during at least one of (b) or (d) for a first predetermined period,
   wherein vacuum pressure in the processing chamber is greater than or equal to 3 Torr and less than or equal to 8 Torr during (b), (c), (d) and (e) and is approximately isobaric during (b), (c), (d) and (e), and
   vacuum pressure in the processing chamber during (f) is greater than or equal to 5 mTorr and less than or equal to 2 Torr.

* * * * *